(12) United States Patent
De Vries et al.

(10) Patent No.: US 11,720,034 B2
(45) Date of Patent: Aug. 8, 2023

(54) LITHOGRAPHIC APPARATUS AND COOLING METHOD

(71) Applicant: ASML Netherlands B.V., Veldhoven (NL)

(72) Inventors: Gosse Charles De Vries, Veldhoven (NL); Nicolaas Ten Kate, Veldhoven (NL)

(73) Assignee: ASML Netherlands B.V., Veldhove (NL)

( * ) Notice: Subject to any disclaimer, the term of this patent is extended or adjusted under 35 U.S.C. 154(b) by 0 days.

(21) Appl. No.: 16/604,976

(22) PCT Filed: Jan. 31, 2018

(86) PCT No.: PCT/EP2018/052391
§ 371 (c)(1),
(2) Date: Oct. 11, 2019

(87) PCT Pub. No.: WO2018/188828
PCT Pub. Date: Oct. 18, 2018

(65) Prior Publication Data
US 2021/0132514 A1    May 6, 2021

(30) Foreign Application Priority Data
Apr. 11, 2017 (EP) ..................... 17165857

(51) Int. Cl.
*G03F 7/20* (2006.01)
*G03F 7/00* (2006.01)

(52) U.S. Cl.
CPC .............. *G03F 7/70891* (2013.01)

(58) Field of Classification Search
CPC ............. G03F 7/70891; G03F 7/70875; G03F 7/70916
See application file for complete search history.

(56) References Cited

U.S. PATENT DOCUMENTS

| | | | |
|---|---|---|---|
| 4,431,269 A | 2/1984 | Barnes, Jr. | |
| 5,376,213 A | 12/1994 | Ueda | |

(Continued)

FOREIGN PATENT DOCUMENTS

| | | |
|---|---|---|
| CN | 101495921 A | 7/2009 |
| CN | 105190443 A | 12/2015 |

(Continued)

OTHER PUBLICATIONS

Kessler, T. et al ; "A sub-40 mHz linewidth laser based on a silicon single-crystal optical cavity" arXiv:1112.3854v2 [phtysics.optics] Jan. 5, 2012 (7 pgs.).

(Continued)

*Primary Examiner* — Steven Whitesell Gordon
(74) *Attorney, Agent, or Firm* — Finnegan, Henderson, Farabow, Garrett & Dunner, LLP

(57) ABSTRACT

A lithographic apparatus arranged to project a pattern from a patterning device onto a substrate, comprising at least one housing comprising at least one internal wall, at least one optical component arranged within at least one chamber defined at least in part by the at least one internal wall and configured to receive a radiation beam and a cooling apparatus arranged to cool at least a portion of the at least one internal wall to a temperature below that of the at least one optical component.

40 Claims, 5 Drawing Sheets

(56) References Cited

U.S. PATENT DOCUMENTS

| | | | |
|---|---|---|---|
| 6,224,248 B1 | 5/2001 | Chiba | |
| 6,253,464 B1 | 7/2001 | Klebanoff et al. | |
| 2002/0171817 A1* | 11/2002 | Babonneau | G06F 7/702 |
| | | | 359/650 |
| 2005/0110966 A1 | 5/2005 | Hasegawa | |
| 2006/0126041 A1 | 6/2006 | Van Dijsseldonk et al. | |
| 2007/0115444 A1* | 5/2007 | Miyazaki | G06F 7/70891 |
| | | | 355/53 |
| 2009/0231707 A1* | 9/2009 | Ehm | G03B 27/16 |
| | | | 359/509 |
| 2013/0107239 A1 | 5/2013 | Clauss | |
| 2013/0176544 A1 | 7/2013 | Hauf et al. | |
| 2015/0332944 A1 | 11/2015 | Landesberger | |
| 2016/0035609 A1 | 2/2016 | Chiou et al. | |
| 2016/0041480 A1* | 2/2016 | Hauf | G03F 7/70266 |
| | | | 355/30 |
| 2016/0147161 A1 | 5/2016 | Nikipelov et al. | |
| 2016/0195818 A1 | 7/2016 | Baer et al. | |
| 2016/0225477 A1* | 8/2016 | Banine | G03F 7/70991 |
| 2016/0225610 A1* | 8/2016 | Chien | G06F 7/7085 |
| 2018/0181008 A1* | 6/2018 | Mahadeswaraswamy | |
| | | | G03F 7/70341 |

FOREIGN PATENT DOCUMENTS

| | | |
|---|---|---|
| EP | 1075672 A1 | 2/2001 |
| EP | 2 009 854 A2 | 12/2008 |
| JP | H11-111602 | 4/1999 |
| JP | 2004-031831 | 1/2004 |
| JP | 2005-051197 A | 2/2005 |
| JP | 2005-064391 | 3/2005 |
| JP | 2006-128682 | 5/2006 |
| JP | 2006-173618 | 6/2006 |
| JP | 2006-253486 | 9/2006 |
| JP | 2007-506932 | 3/2007 |
| JP | 2008-500736 | 1/2008 |
| JP | 2009-010393 | 1/2009 |
| JP | 2009-500795 | 1/2009 |
| JP | 2009-300167 | 12/2009 |
| JP | 2010-503980 | 2/2010 |
| JP | 2013-545272 | 12/2013 |
| JP | 2014-528173 | 10/2014 |
| KR | 20000006321 A | 1/2000 |
| KR | 20030070854 A | 9/2003 |
| TW | 200834246 A | 8/2008 |
| TW | 200842506 A | 11/2008 |
| WO | WO 99/57607 | 11/1999 |
| WO | WO 2018/188828 A1 | 10/2013 |
| WO | WO 2016/091486 | 6/2016 |
| WO | WO 2016/169758 | 10/2016 |

OTHER PUBLICATIONS

Paquin, Roger A.; "Materials for mirror systems: an overview"; 2 / SPIE vol. 2543; (10 pgs,). http://proceedingspsiedigitallibrary.org on Nov. 18, 2016 terms of Use: http://spiedigitallibrary.org/ss/termsofuse.aspx.

PCT Notification of Transmittal of the International Search Report and the Written Opinion of the International Searching Authority, or the Declaration dated Sep. 26, 2018, in corresponding PCT International Application No. PCT/EP2018/052391 (21 pgs.).

Matei et al.; "A second generation of low thermal noise cryogenic silicon resonators"; Journal of Physics; Conference Series 723 (2016) 012031; IOP Publishing; 8$^{th}$ Symposium on Frequency Standards and Metrology 2015; doi: 10.1088/17426596/723/1/012031 (8 pgs.).

Notification of Reason(s) for Refusal issued in related Japanese Patent Application No. 2019-555660; dated Nov. 2, 2021 (10 pgs.).

First Office Action issued in related Chinese Patent Application No. 2018800242755; dated Jul. 14, 2021 (19 pgs.).

Office Action of the Intellectual Property Office issued in related Taiwan Patent Application No. 107107354; dated Nov. 25, 2021 (23 pgs.).

Office Action of the Intellectual Property Office issued in related Taiwanese Patent Application No. 107107354; dated Jul. 22, 2022 (20 pgs.).

* cited by examiner

LITHOGRAPHIC APPARATUS AND COOLING METHOD

CROSS-REFERENCE TO RELATED PATENT APPLICATIONS

This application is a national stage filing under 35 U.S.C. § 371 of International Application No. PCT/EP2018/052391, filed on Jan. 31, 2018, and published as WO 2018/188828 A1, which claims priority of EP application no, 17165857.8, which was filed on 11 Apr. 2017. The contents of these applications are each incorporated herein by reference in their entirety.

FIELD

The present invention relates to a lithographic apparatus arranged to project a pattern from a patterning device onto a substrate, and particular to cooling methods and systems for such lithographic apparatuses.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

The radiation may be produced using a plasma. The plasma may be created, for example, by directing a laser beam at a fuel in the radiation source. The resulting plasma may emit the EUV radiation. Such a radiation source is known as a laser produced plasma (LPP) radiation source. Within such an LPP radiation source at least a portion may not be converted to a plasma resulting in the emission of contaminants, which may travel into the lithographic apparatus. Other contaminants (such as water) may also be present within the lithographic apparatus and these may condensate on optical components (such as lenses, mirrors, windows, etc.) of the lithographic apparatus. It will be appreciated that the optical components have optical surfaces. The terms optical components and optical surfaces may be used interchangeably herein. A flow of gas, such as hydrogen, may be introduced into the lithographic apparatus in order to flush particulate contaminants and/or react with deposits thereby yielding volatile species that can be pumped away from the lithographic apparatus.

The use of such gases includes a number of drawbacks. For example, use of some gasses such as hydrogen may result in degradation of some materials used within the lithographic apparatus, such as some layers of multilayer mirrors. Additionally, as is well known in the art, EUV radiation is absorbed by hydrogen gas, resulting in reduced power at the substrate. Finally, the need to purge the lithographic apparatus of hydrogen may necessitate the use of relatively complex and expensive apparatuses, such as dynamic gas locks (DGLs) and hydrogen-safe handling equipment.

SUMMARY

According to a first aspect described herein, there is provided a lithographic apparatus arranged to project a pattern from a patterning device onto a substrate. The lithographic apparatus comprises at least one housing. The at least one housing comprises at least one internal wall. At least one optical component is arranged within at least one chamber defined at least in part by the at least one internal wall and configured to receive a radiation beam. The lithographic apparatus comprises a cooling apparatus arranged to cool at least a portion of the at least one internal wall to a temperature below that of the at least one optical component such that during use of the cooling apparatus at least one contaminant within the housing rests preferentially on the internal wall relative to the optical component.

By cooling the at least a portion of the at least one internal wall to a temperature below that of the at least one optical component, contaminants will preferentially rest on the internal wall, thereby reducing contamination of the optical components. This in turn results in improved overlay accuracy. The lithographic apparatus of the first aspect also allows for reduced usage or elimination of hydrogen within the lithographic apparatus. The reduction or elimination of, for example hydrogen gas, from within internal cavities of the lithographic apparatus allows for use of materials which would otherwise be unusable without protective "capping" layers and improves the lifetime of components.

The cooling apparatus may be arranged to provide a difference in temperature between the at least a portion of the at least one internal wall and the at least one optical component of at least 10 K and preferably at least 40 K. By providing a large temperature difference, vapour pressure of contaminants present on the at least a portion of the at least one internal wall will be substantially lower than that of vapour pressure on the at least one optical component, thereby leading to contaminants to mostly remain on the at least a portion of the internal wall.

The cooling apparatus may be arranged to cool the at least a portion of the internal wall to a temperature of 77 K or below. In this way, a particularly suitable temperature difference may be provided while allowing for a convenient coolant in the form of liquid nitrogen at a pressure of 1 bar.

The at least one housing may comprise at least one of an illumination system configured to condition a radiation beam; a support structure constructed to support a patterning device, the patterning device being capable of imparting the radiation beam with a pattern in its cross-section to form a patterned radiation beam; a substrate table constructed to hold the substrate; and a projection system configured to project the patterned radiation beam onto the substrate.

The lithographic apparatus may be arranged to provide an ultra-high vacuum within a chamber at least partially defined by the at least one internal wall. In this way, absorption of an EUV radiation beam by gasses within the lithographic apparatus may be minimized.

The at least one contaminant may comprise at least one of hydrocarbons and water.

The cooling apparatus may be arranged to provide liquid nitrogen to the at least one internal wall.

The at least one optical component may comprise at least one selected from the list including: a mirror, a lens, the substrate and a patterning device.

The lithographic apparatus may further comprise at least one further cooling apparatus, the at least one further cooling apparatus arranged to cool the at least one optical component. In this way, the optical components may be cooled to reduce or prevent deformation.

The at least one further cooling apparatus may comprise a substrate cooling apparatus arranged to cool the substrate. The substrate cooling apparatus may be arranged to cool a substrate table constructed to hold the substrate.

The substrate cooling apparatus may comprises a coolant container within, or in thermal communication with, the substrate table; a coolant supply apparatus arranged for releasable connection to the coolant container and arranged to provide coolant to the coolant container and to drain spent coolant from the coolant container. In this way, the substrate maybe cooled while allowing for scanning operations during exposure of the substrate.

The coolant container may be arranged to hold liquid nitrogen at a pressure of 30 bar. In this way, the substrate may be cooled to a temperature of around 123 K. 123 K is the zero-crossing-temperature of the coefficient of thermal expansion of silicon. As such, this arrangement provides for very low expansion of the substrate during use.

The at least one optical component may comprise at least one of: one or more optical components within the illumination system; the patterning device; and one or more optical components within the projection system.

The at least one optical component may comprise a material having a zero-crossing-temperature of a coefficient of thermal expansion and the cooling apparatus is arranged to cool the at least one optical component such that the at least one optical component is maintained within a predetermined range of temperatures around the zero-crossing-temperature during an exposure operation of the lithographic apparatus.

The at least one optical component may be constructed from silicon.

The at least one further cooling apparatus may be arranged to cool the at least one optical component to a temperature of between approximately 122 and 125 K prior to an exposure operation of the lithographic apparatus.

The at least one further cooling apparatus may be arranged to provide liquid nitrogen to the at least one optical component or to a component in thermal contact with the at least one optical component.

The lithographic apparatus may further comprise a source arranged to generate the radiation beam in the form of an EUV radiation beam.

There is also described herein a method comprising: cooling at least a portion of at least one internal wall of a lithographic apparatus arranged to project a pattern from a patterning device onto a substrate, the cooling comprising cooling to a temperature below that of at least one optical component arranged within at least one chamber defined at least in part by the at least one internal wall, the optical component configured to receive a radiation beam; and the cooling being such that during the cooling at least one contaminant within the chamber rests preferentially on the internal wall relative to the optical component.

Cooling at least a portion of at least one internal wall may be performed prior to an exposure operation of the lithographic apparatus.

Cooling at least a portion of at least one internal wall may provide a difference in temperature between the at least a portion of the at least one internal wall and the at least one optical component of at least 10 K and may provide a difference in temperature of at least 40 K.

Cooling at least a portion of at least one internal wall may cool the at least a portion of the internal wall to a temperature of 77 K or below.

The cooling may provide an ultra-high vacuum within a chamber at least partially defined by the at least one internal wall.

The at least one contaminant may comprise at least one of: hydrocarbons and water.

Cooling at least a portion of at least one internal wall may comprise providing liquid nitrogen to the at least one internal wall.

The at least one optical component may comprise at least one of: a mirror, a lens, the substrate and a patterning device.

The method may further comprise cooling the at least one optical component. Cooling the at least one optical component may comprise cooling the substrate. Cooling the substrate may comprise cooling a substrate table constructed to hold the substrate.

Cooling the at least one optical component may comprise cooling the at least one optical component such that the at least one optical component is maintained within a predetermined range of temperatures around a zero-crossing-temperature of a coefficient of thermal expansion of the optical component during an exposure operation of the lithographic apparatus.

Cooling the at least one optical component may comprise cooling the at least one optical component to a temperature of between approximately 122 and 125 K prior to an exposure operation of the lithographic apparatus.

Cooling the at least one optical component may comprise providing liquid nitrogen to the at least one optical component or to a component in thermal contact with the at least one optical component.

The method may further comprise prior to an exposure operation of the lithographic apparatus: heating the at least one optical component to increase a temperature difference between the at least one optical component and the at least a portion of the at least one internal wall.

Cooling the at least one optical component may occur after the heating of the at least one optical component.

According to another arrangement described herein, there is provided a lithographic apparatus arranged to project a pattern from a patterning device onto a substrate, the lithographic apparatus comprising: at least one optical component configured to receive a radiation beam; and at least one cooling apparatus arranged to cool the at least one optical component; wherein the at least one optical component comprises a material having a zero-crossing-temperature of a coefficient of thermal expansion and the at least one cooling apparatus is arranged to cool the at least one optical component such that the at least one optical component is maintained within a predetermined range of temperatures around the zero-crossing-temperature during an exposure operation of the lithographic apparatus.

In some embodiments, at the zero-crossing-temperature of the material of the optical component:

$$\frac{d\alpha/dT}{k} < 1.2 \times 10^{-9}$$

where T is temperature, α the coefficient of thermal expansion, and k is the thermal conductivity of the material.

The at least one optical component may comprise at least one selected from the list comprising: a mirror, a lens, the substrate and a patterning device.

The at least one optical component may be constructed from silicon.

The at least one cooling apparatus may be arranged to cool the at least one optical component to a temperature of between approximately 122 and 125 K prior to an exposure operation of the lithographic apparatus.

The at least one cooling apparatus may be arranged to cool the at least one optical component to a temperature of approximately 123 K during an exposure operation of the lithographic apparatus.

The at least one cooling apparatus may comprise a substrate cooling apparatus arranged to cool the substrate.

The substrate cooling apparatus may be arranged to cool a substrate table constructed to hold the substrate.

The substrate cooling apparatus may comprise a coolant container within, or in thermal communication with, the substrate table; a coolant supply apparatus arranged for releasable connection to the coolant container and arranged to provide coolant to the coolant container and to drain spent coolant from the coolant container.

The coolant container may be arranged to hold liquid nitrogen at a pressure of 30 bar.

The at least one cooling apparatus may be arranged to provide liquid nitrogen to the at least one optical component or to a component in thermal contact with the at least one optical component.

It will be appreciated that one or more aspects or features described in the preceding or following descriptions may be combined with one or more other aspects or features.

BRIEF DESCRIPTION OF THE DRAWINGS

Embodiments of the invention will now be described, by way of example only, with reference to the accompanying schematic drawings, in which.

DETAILED DESCRIPTION

Figure 1:
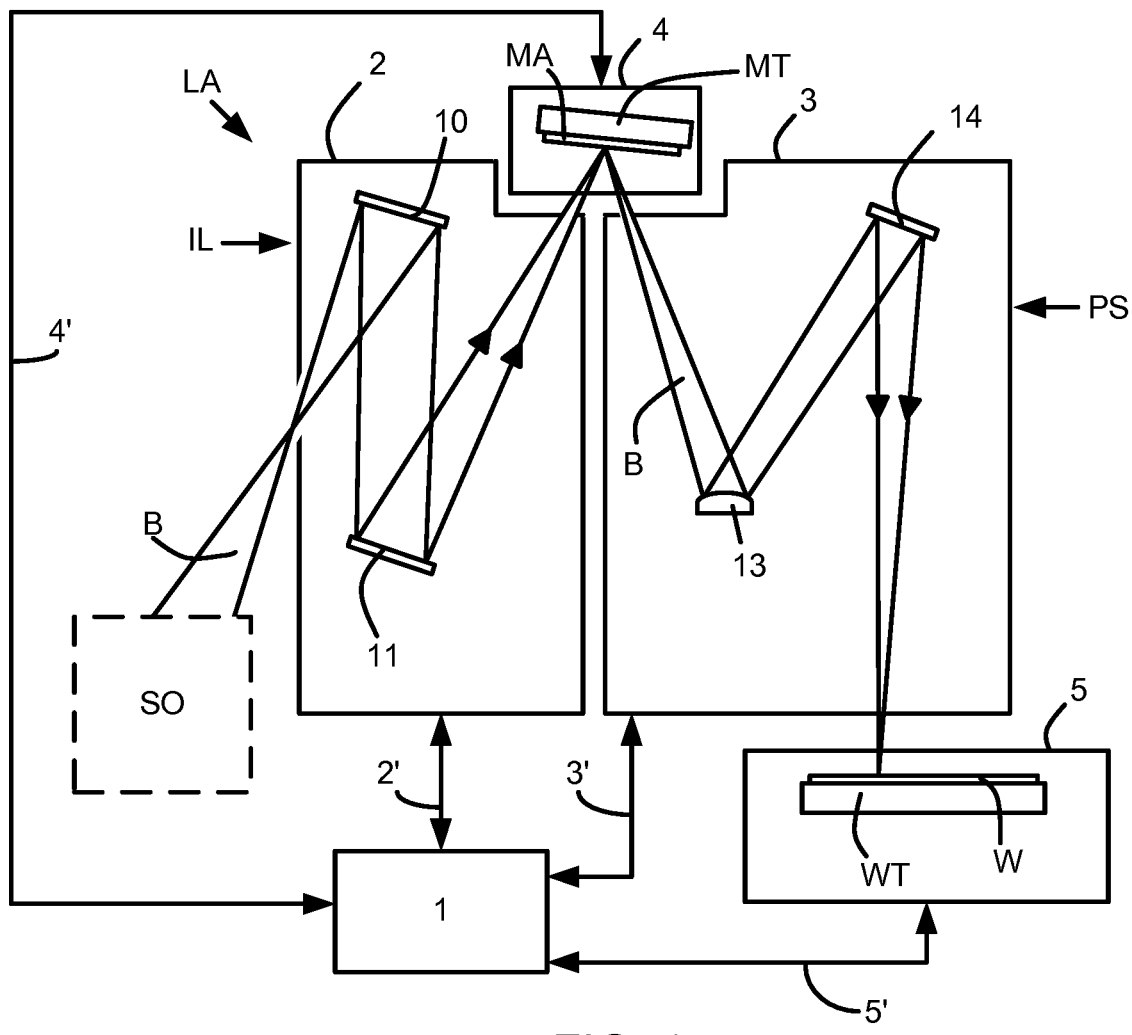
FIG. 1 schematically depicts a lithographic system comprising a lithographic apparatus according to an embodiment described herein.

FIG. 1 schematically illustrates a lithographic system including a cooling apparatus 1 operable to cool one or more internal walls 2, 3, 4, 5 of a lithographic apparatus LA to temperatures below that one or more components positioned within the internal walls 2-5 of the lithographic apparatus LA. For example, and as described in detail below, the cooling apparatus 1 may be operable to cool one or more internal walls 2-5 of the lithographic apparatus LA to temperatures below that of radiation-receiving components such as mirrors, lenses, masks (e.g., reticles), substrates (e.g., wafers), etc. The lithographic system may also comprise a radiation source SO. Generally, a radiation source SO is configured to generate a radiation beam B, which may be, for example, an extreme ultraviolet (EUV) radiation beam B. The radiation source may be, for example, a type referred to as a laser produced plasma (LPP) source, but may be of any appropriate type including discharge produced plasma (DPP), or a free electron laser-based (FEL) sources. Suitable sources of radiation beams for lithography are known in the art and are not discussed in detail herein.

The lithographic apparatus LA comprises an illumination system IL having a housing with internal walls 2, a support structure MT configured to support a patterning device MA (e.g. a mask) each positioned within a housing having internal walls 4, a projection system PS having a housing with internal walls 3 and a substrate table WT configured to support a substrate W each positioned within a housing having internal walls 5. The illumination system IL is configured to condition a received radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The radiation source SO, illumination system IL, projection system PS, support structure MT, mask MA, substrate table WT and/or substrate W may all be constructed and/or arranged such that they can be isolated from the external environment (e.g. by way of the housings thereof). A gas at a pressure below atmospheric pressure (e.g. hydrogen) may be provided in the radiation source SO. A vacuum may be provided in one or more of the illumination system IL (e.g. within the internal walls 2), and/or the projection system PS (e.g. within the internal walls 3). A small amount of gas (e.g. hydrogen) at a pressure well below atmospheric pressure may be provided in one or more of the illumination system IL (e.g. within the internal walls 2) and/or the projection system PS (e.g. within the internal walls 3), although as described in more detail below, some embodiments described herein reduce, or remove, the need for such gas to be provided.

Figure 2:
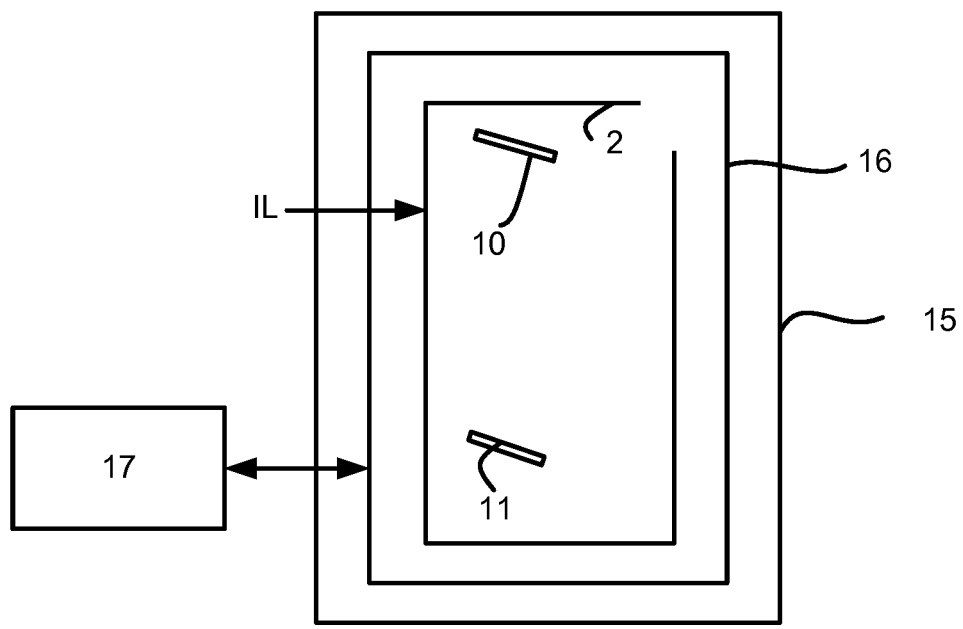
FIG. 2 schematically illustrates an illuminator of the lithographic apparatus of FIG. 1 according to an embodiment described herein.

While the internal walls 2-5 are depicted in FIG. 1, it will be appreciated that the housings of the lithographic apparatus may comprise other walls which are not depicted (such as outer walls). For example, in an embodiment, the housings of the lithographic apparatus may comprise one or more heat shields positioned between one or more of the internal walls 2-5 and an outer wall. With reference to FIG. 2, the illuminator IL is schematically shown together with an outer wall 15. While for ease of representation, the outer wall is shown surrounding the illuminator IL, it is to be understood that the outer wall may surround other components of the lithographic apparatus such as the projection system PS and may surround the entire lithographic apparatus LA. Positioned between the internal wall 2 and the outer wall 15 is a heat shield 16. While shown as a continuous barrier, it will be appreciated that the heat shield may be formed in any appropriate manner and may comprise one or more walls or plates. The outer wall 15 may be at an ambient temperature (for example 300 K). The heat shield 16 may be cooled to a temperature between that of the outer wall 15 and the internal wall 2. For example, a cooling apparatus 17 may be arranged to cool the heat shield 16. While depicted separately in FIG. 2, it is to be understood that the cooling apparatus 17 and the cooling apparatus 1 may be provided by the same cooling apparatus. By cooling the heat shield 16 to an intermediate temperature, the heat shield 16 reduces the radiation load on the internal wall 2, thereby easing cooling of the internal wall 2. The heat shield 16 may be made from any suitable material. The heat shield 16 may be highly reflective to infrared radiation, thereby reducing infrared radiation emitted from the heat shield 16 to the internal wall 2. It will be appreciated that other heat shields may be provided around other components of the lithographic apparatus LA.

It will further be appreciated that the lithographic apparatus LA may comprise housing arrangements different to that depicted in FIG. 1. For example, in some embodiments, one or more of the depicted housings may not be present. In some embodiments, components depicted within two or more respective housings may be provided within the same housing and vice versa. For example, in an embodiment, the lithographic apparatus may comprise a single housing having internal walls which enclose all of the optical components of the lithographic apparatus.

The radiation beam B passes from the radiation source SO into the illumination system IL, which is configured to condition the radiation beam. Within the internal walls 2 of the illumination system IL, there may be included a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. Within the internal walls 3 of the projection system, there may be a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 1, the projection system may include any number of mirrors (e.g. six mirrors).

The radiation source SO shown in FIG. 1 may include components which are not illustrated. For example, a spectral filter may be provided in the radiation source. The spectral filter may be substantially transmissive for EUV radiation but substantially blocking for other wavelengths of radiation such as infrared radiation.

As discussed above, the cooling apparatus 1 is arranged to cool one or more internal walls of the lithographic apparatus LA to a desired temperature. In the example depicted in FIG. 1, the cooling apparatus 1 is arranged to cool one or more of the internal walls 2-5. In one embodiment, the cooling apparatus 1 is arranged to cool the internal walls 2-5 to a temperature below a temperature of components housed within the internal walls. For example, the cooling apparatus 1 may be arranged to cool the internal walls 2 to a temperature below that of the mirrors 10, 11, to cool the internal walls 3 to a temperature below that of the mirrors 13, 14, to cool the internal walls 4 to a temperature below that of the patterning device MA and the support structure MT and to cool the internal walls 5 to a temperature below that of the substrate table WT and the substrate W. More generally, the cooling apparatus 1 may be arranged to cool the internal walls 2-5 to a temperature below that of the optical components of the lithographic apparatus.

By cooling the internal walls 2-5 to a temperature below that of the components housed within those internal walls, contaminants which form condensates on surfaces within the lithographic apparatus LA will preferentially condense on the internal walls 2-5, rather than condensing on the components housed within the internal walls 2-5. In this way, contamination of the optical surfaces of the lithographic apparatus LA (e.g. those surfaces which interact with the radiation beam B) is significantly reduced. To reduce or eliminate condensation on optical surfaces, the temperature of the internal walls 2-5 is preferably substantially lower than the temperature of the optical components. The difference between the optical components and the internal walls 2-5 may be expressed in terms of a difference in vapour pressure for different temperatures of the walls 2-5 in comparison to the optical components. As will be appreciated by those skilled in the art, the difference in vapour pressure is governed by the Clausius-Clapeyron equation.

The reduction in contamination that is achieved through cooling the internal walls 2-5 to a temperature below that the components housed within the internal walls 2-5 is such that the need for gas-based contamination reduction mechanisms may be reduced or eliminated. For example, while in known lithographic apparatuses flows of gas (such as hydrogen) may be utilized to flush contaminants from the lithographic apparatus LA, in embodiments of the present invention the need for such gas flows is reduced or eliminated because condensates preferentially and non-problematically form on the colder surfaces of the internal walls 2-5.

In some embodiments, a further reduction the amount of condensed material on the optical surfaces of the lithographic apparatus is achieved by heating the optical surfaces while cooling the internal walls 2-5. For example, in an embodiment, the optical surfaces may be heated to a temperature of 100 degrees C. In some embodiments, once the internal walls 2-5 have reached a low steady state temperature, and all volatile species (except for noble gasses, $H_2$, and to a lesser extent $N_2$ and $O_2$) have condensed on the walls 2-5, heating of the optical surfaces may cease to allow the temperature of the optical components to be restored to an ambient operating temperature or to be cooled to a lower temperature (as described below), without the risk of forming condensates on the optical components. In some embodiments, therefore one or more of the optical components of the lithographic apparatus may be provided with heaters suitable for raising the temperature of the optical components.

The reduction or elimination of, for example hydrogen gas, from within internal cavities (e.g. cavities formed by the internal walls 2-5) of the lithographic apparatus LA is such that materials may be used within those cavities which would otherwise be unusable (without protective "capping" layers) and such that the lifetime of components is improved. For example, within the illuminator IL and the projection system PS, the mirrors 10-14 may comprise multi-layer mirrors. In known lithographic apparatuses, the choice of materials which may be used to form the layers of such multi-layer mirrors is limited by the presence of hydrogen gas within the illuminator IL and the projection system PS. Where it is desired to use a specific material despite that material's reactivity with hydrogen and/or the EUV photon-induced hydrogen plasma, such materials may be provided with a protective "capping" layer to increase lifespan. However, EUV radiation is particularly strongly absorbed, and such capping layers can reduce the amount of EUV radiation that is directed to subsequent components of the lithographic apparatus, and in particular the substrate W.

Similarly, in known lithographic apparatuses, the patterning device MA may be protected from contamination by a film known as a pellicle (not shown). A pellicle may, for example, be formed from a material such as polysilicon (pSi) film. Polysilicon (pSi) film may be made largely transparent to EUV radiation. For example, a pellicle may have a transmission loss of the 0.17% per nm layer thickness. A pellicle may alternatively be formed from some other material which may be made largely transparent to EUV radiation, for example graphene, silicene, etc. The pellicle itself may be protected by a capping layer, like $Si_3N_4$, to reduce the effect of hydrogen radicals, plasma and traces of oxygen on the pellicle. However, as indicated above, because EUV radiation is readily absorbed by matter, the addition of a capping layer does reduce the amount of EUV radiation (typically 0.86% transmission loss per nm for a $Si_3N_4$ capping layer) that passes from the patterning device MA to the projection system PS. By cooling the walls 4 to a temperature below that of the patterning device MA and the support structure MT, contaminants will preferentially condense on the internal walls 4, reducing the need for a pellicle. Where a pellicle is still necessary to prevent the detrimental effect of imaging particles that may be incident on the surface of the patterning device MA, removal or reduction of hydrogen within the internal walls 4 reduces the need for a capping layer on the pellicle, thereby improving EUV transmissivity of the pellicle, making construction of the pellicle more straightforward and less expensive, and extending the operating lifetime of the pellicle.

Similarly, metals within the lithographic apparatus LA may be subject to hydrogen embrittlement, making the use of otherwise beneficial materials (including alloys of vanadium, nickel and titanium) difficult. Embodiments described herein, through allowing a reduction (or elimination) of hydrogen within the lithographic apparatus, enable such materials to be used. By way of example only, embodiments described herein allow for the use of materials such as titanium in the formation of manifolds.

Similarly, the choice of materials for use in the construction of the internal walls 2-5 may be expanded, allowing for the selection of materials with good thermal conductivity and thereby providing a "virtuous circle" by allowing for more efficient cooling of the internal walls 2-5 to a temperature below that of the components housed within the internal walls 2-5.

Figure 3:
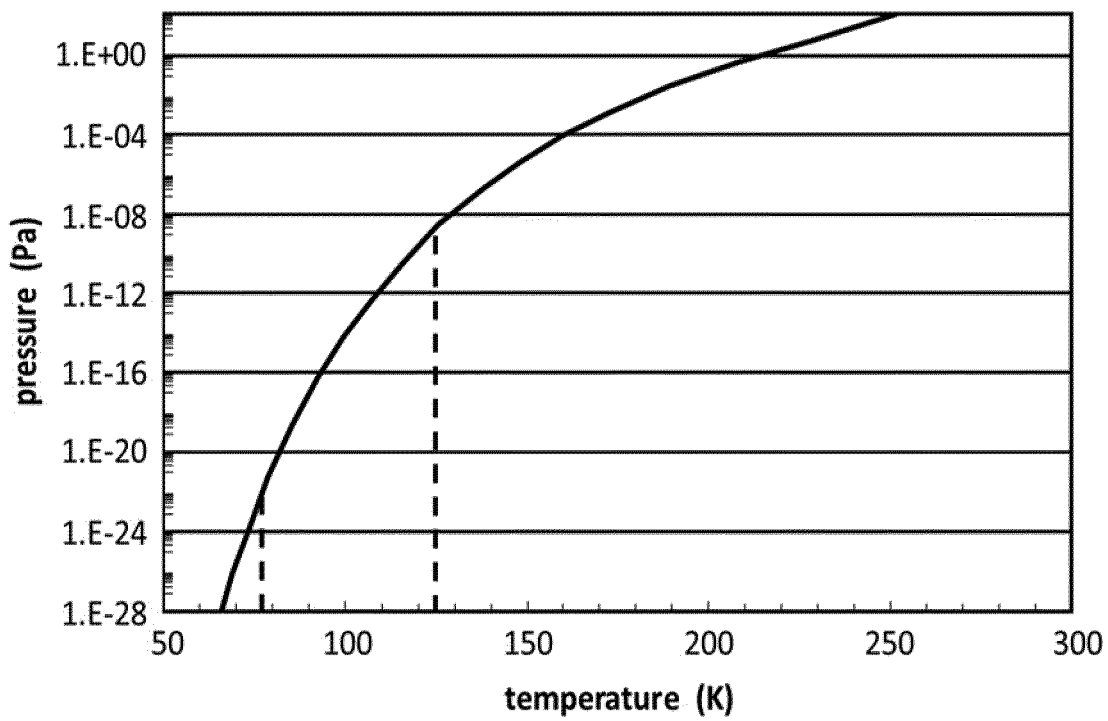
FIG. 3 is a graph illustrating how vapour pressure of water varies with temperature.

In one particularly beneficial embodiment, the cooling apparatus 1 is arranged to cool the internal walls 2-5 to a temperature of approximately 77 K or lower. As described above, the difference in vapour pressure between two surfaces is governed by the Clausius-Clapeyron equation. FIG. 3 is a graph showing how the vapour pressure of water (y axis) changes with temperature (x axis). From FIG. 3, it can be seen that the vapour pressure of water on a surface with a temperature of 77 K is over twelve orders of magnitude less than the vapour pressure of water on a surface with a temperature of approximately 123 K. As will be discussed in further detail below, in some embodiments it is desirable to cool the optical components to a temperature of approximately 123 K. Given this, and given that liquid nitrogen has a temperature of 77 K at 1 bar, cooling the internal walls 2-5 to a temperature of 77 K is particularly beneficial.

It will be appreciated, however, that the internal walls 2-5 may be cooled to other temperatures to provide a temperature difference between the internal walls 2-5 and the optical components. For instance, the internal walls 2-5 may be cooled to 100 K and the optical components may be maintained at 300 K, resulting in condensation of water vapour on the internal walls 2-5.

In an embodiment, a temperature difference of at least 20 K and preferably at least 40 K is maintained between the optical components and the inner walls 2-5.

In an embodiment, the internal walls 2-5 are first cooled while maintaining the optical components at ambient temperature or heating the optical components to a temperature above ambient temperature. Once undesired volatile species have condensed on the cold walls 2-5, the temperature of the optical components is restored to room temperature (when heated) or cooled to a lower temperature (as is described in more detail below). In this way, the amount by which the internal walls need be cooled may be reduced. That is, by heating the optical components (or maintaining the optical components at room temperature) a larger temperature difference can be obtained between the optical components and the internal walls allowing contaminants to condense on the internal walls 2-5. Once the contaminants have condensed on the internal walls 2-5, the optical components may be cooled as described below.

To cool the walls 2-5 to a temperature of approximately 77 K, the cooling apparatus 1 may comprise a liquid nitrogen cooling system. For example, the cooling apparatus 1 may be arranged to pump liquid nitrogen through schematically depicted conduits 2'-5'. Liquid nitrogen may be pumped through channels (not shown) that contact an outer-surface of the internal walls 2-5 or which pass through the internal walls 2-5. It will be appreciated that the cooling apparatus 1 may be arranged in any way which is suitable for cooling one or more of the internal walls 2-5 of the lithographic apparatus LA. It will be appreciated that the necessary volume of coolant (e.g., liquid nitrogen) provided to the internal walls 2-5 may depend upon the heat load on the internal walls 2-5. This heat load in turn depends for instance on the insulation and a number of considerations including construction/material of the internal walls and the duration of scanning operations performed.

While depicted schematically by a single box in FIG. 1, it will be appreciated that the cooling apparatus 1 may comprise a plurality of components. For example, the cooling apparatus 1 may comprise one or more temperature sensors allowing for the cooling apparatus to operate under a feedback control-loop.

It is described above that an amount of hydrogen used within the illumination system IL and the projection system PS may be reduced. In one embodiment, an ultra-high vacuum (i.e., a pressure of less than approximately $10^{-7}$ Pa) may be maintained within one or more cavities defined by the internal walls 2-5. Where one or more of the internal walls 2-5 of the lithographic apparatus LA are cooled to approximately 77 K, those internal walls will act as "cryopumps" by trapping gases and vapours through condensation on the internal walls, thereby aiding the creation of an ultra-high vacuum environment within the cavities defined by those internal walls. In other embodiments, the internal walls are cooled to a different temperature. Indeed, the temperature at which gasses will condense on a cooled surface depends upon the particular gas and as such, the temperature may be selected in dependence upon expected contaminants. In other embodiments, the internal walls are not cooled sufficiently to provide cryopumping for all contaminants, but are cooled sufficiently to provide at least cryotrapping for substantially all gasses and vapours. Cryotrapping refers to the process in which gasses, while not condensing on the internal walls, become resident on the internal walls for a sufficient period of time to deplete the kinetic energy of those gasses and thereby prevent contamination of other surfaces within the lithographic apparatus LA.

It will be appreciated that while the internal walls may be cooled through the use of liquid nitrogen, other cooling mechanisms may be used. For example, helium or hydrogen cooling may also be utilized. It will further be appreciated that while it is schematically depicted in FIG. 1 that the internal walls 2-5 fully or substantially enclose the optical components (such as the mirrors 10-15, the patterning device MA and the substrate W), it will be appreciated in some embodiments only portions of the internal walls 2-5 are cooled. With exemplary reference to the illuminator IL, only a portion of the internal wall 2 may be cooled, rather than cooling the entirety of the internal wall 2. For example, portions of the internal wall 2 which are within the vicinity of the mirrors 10, 11 may be cooled.

While at least some of the internal components of the lithographic apparatus LA are maintained at a warmer temperature than at least some of the internal walls 2-5, it may nonetheless be desirable to cool such internal components. For example, it may be desirable to cool one or more of the optical components (such as the mirrors 10-14) to prevent thermal expansion due to heating caused by incidence of the radiation beam B on those mirrors. Beneficially, in an example embodiment in which the internal walls 2, 3 are colder than the mirrors 10-14, the mirrors 10-14 will be cooled through radiation. Similarly, where the internal walls 4, 5 are cooled to a temperature below that of the patterning device MA, support structure MT, substrate table WT and substrate W, the patterning device MA, support structure MT, substrate table WT and substrate W will be cooled through radiation. As such, cooling the internal walls 2-5 of the lithographic apparatus LA reduces the burden on other cooling systems, such as cooling systems arranged to cool the mirrors 10-14, the patterning device MA, the support structure MT, the substrate table WT and the substrate W (described below).

In addition to cooling through radiation, components of the lithographic apparatus LA may themselves be actively cooled. Active cooling the components of the lithographic apparatus LA may, for example, reduce deformation of those components during use. Generally, as optical components of the lithographic apparatus (such as mirrors 10-14, the patterning device MA and the substrate W) are heated by interaction with the radiation beam B, those optical components undergo deformation. Deformation of optical components can result in degradation of the optical performance of the lithographic apparatus, which in turn may lower the accuracy with which features are formed on the substrate W.

It is known for optical components (such as mirrors 10-14) within the lithographic apparatus LA to be constructed from ultra-low expansion (ULE®) glass made by Corning Incorporated of New York, USA. ULE glass has a coefficient of thermal expansion (CTE) of zero at the so-called "zero crossing temperature" (ZCT). The ZCT of a particular ULE glass may vary in dependence upon the particular make-up of that ULE glass and can be purposely tuned to some extent. However, the heat conductivity of ULE is relatively low (of the order of 1.3 W/m/K at its ZCT).

As such, it is difficult to maintain a component which is constructed from ULE glass at the ZCT. That is, as a ULE glass component absorbs heat through interaction with the radiation beam B, it is relatively difficult to drain that absorbed heat. As such, even mirrors constructed from ULE glass may experience deformation.

Furthermore, while the zero-crossing temperature may vary for different components (constructed from different ULE glass), it is also known for the zero-crossing temperature to vary across a single component, leading to additional difficulty maintaining the entire component at the zero-crossing temperature.

In an embodiment, optical components within the lithographic apparatus are constructed from a material having a CTE of zero at the ZCT of that material, but with heat conductivity higher than 1.3 W/m/K. Preferably, the ZCT and the CTE are uniform over the entirety of the optical component. The term optical component is to be understood to include the substrate table WT and the support structure MT although the radiation beam B may not (and may never) be directly incident on those components.

Figure 4:
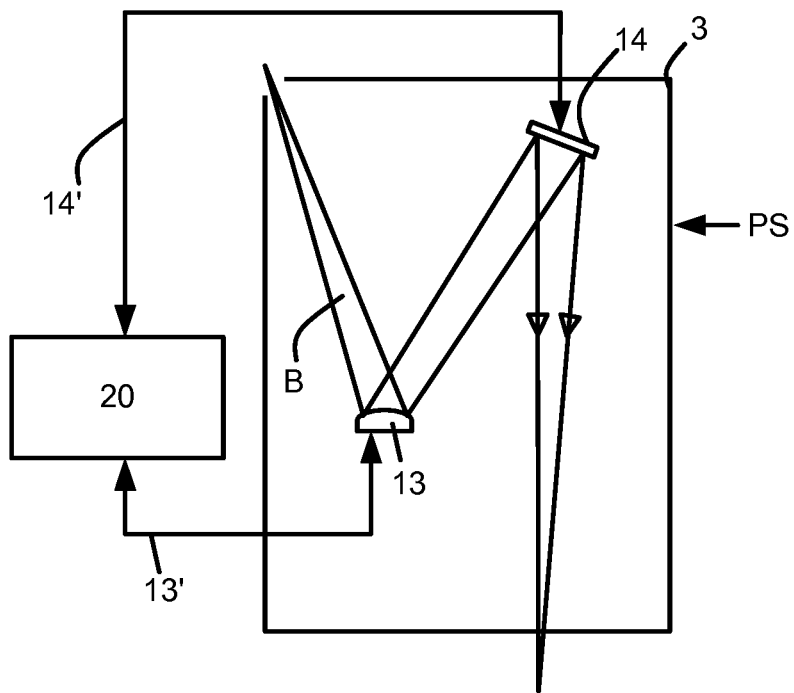
FIG. 4 schematically depicts a cooling system for a projection system of a lithographic apparatus according to an embodiment described herein.

In a particularly beneficial embodiment, one or more optical components are formed from silicon. An exemplary arrangement of projection system PS is schematically in FIG. 4. In FIG. 4, the projection system PS is generally as depicted in FIG. 1. In the embodiment of FIG. 4, however, a cooling apparatus 20 is operable to cool the mirrors 13, 14. For example, the cooling apparatus 20 may be operable to cool the mirrors 13, 14 to a temperature of approximately 123 K. The cooling apparatus 20 may be arranged to cool the mirrors 13, 14 to an initial temperature (i.e. a temperature at the start of a scanning operation) of approximately 120 K. During scanning, receipt of the radiation beam B may cause the mirrors 13, 14 to become heated to a temperature of approximately 130 K.

It has been determined that at a temperature of approximately 123 K, silicon has a CTE of 0 (zero), and a heat conductivity of 600 W/m/K Generally, for silicon at approximately 123 K (the ZCT of silicon), the change in CTE with respect to temperature (da/dT) is approximately one order of magnitude larger than the change of temperature of ULE glass at a given ZCT of ULE glass. However, it will be appreciated that a heat conductivity of 600 W/m/K is of the order of 500 times greater than the heat conductivity of CTE at its ZCT. While the change in CTE with respect to temperature varies non-linearly, constructing the mirrors 13, 14 from silicon, and cooling the mirrors 13, 14 to a temperature of approximately 123 K, a typical or average improvement (i.e. reduction) in the deformation of the mirrors 13, 14 may be achieved of a factor of 50 in comparison to when the mirrors 13, 14 are constructed from ULE glass and operating at their ZCT.

Further, silicon may be obtained in large monocrystalline ingots from which an optical component (e.g. a mirror) may be constructed, thereby providing homogeneous properties of, for example, ZCT, CTE and heat conductance, across an entire surface of an optical component. In this way, for example, where the mirrors 13, 14 are constructed from silicon, the cooling apparatus 20 is able to cool the entirety of the mirrors 13, 14 to a consistent temperature of approximately 123 K and thereby provide substantially zero thermally induced expansion across the entirety of the mirrors 13, 14.

It will be appreciated that the mirrors 11, 10, and other optical components not depicted in FIG. 1 or 2, may be similarly constructed. In some embodiments, one or more further cooling apparatus may be provided to cool those optical components (as described with reference to FIGS. 3 to 6 below).

The cooling apparatus 20 may be arranged to cool and pump liquid nitrogen through schematically depicted conduits 13'-14'. In an embodiment, liquid nitrogen may be pumped through channels (not shown) that contact an 'underside' (i.e. a side which does not receive the radiation beam B) of the mirrors 13, 14 or which pass through a body of the mirrors 13, 14. It will be appreciated that the cooling apparatus 20 may be arranged in any way which is suitable for cooling one or more of the mirrors 13, 14. It will be appreciated that the necessary volume of liquid nitrogen provided to the mirrors 13, 14 will depend upon construction of the mirrors 13, 14, the duration of scanning operations performed and the heat load caused by the radiation beam B received at the mirrors 13, 14.

It will be appreciated that where liquid nitrogen is used as a coolant, the liquid nitrogen may be pressurized (e.g., up to approximately 28.7 bar) so as to maintain a temperature of 123 K. In an alternative example, the optical components (such as the mirrors 13, 14) may be cooled with liquid nitrogen at 77 K (e.g., at 1 bar) via a thermal resistance of appropriate value, where the temperature of the optical component may be controlled via a heater (not shown) operating under a feedback loop using signals from a temperature sensor (not shown).

While depicted schematically by a single box in FIG. 4, it will be appreciated that the cooling apparatus 20 may comprise a plurality of components. For example, the cooling apparatus 20 may comprise one or more temperature sensors allowing for the cooling apparatus to operate under a feedback control-loop.

While, for the reasons described above, silicon provides a particularly beneficial material from which to construct optical components of the lithographic apparatus LA, more generally it is to be understood that an improvement (i.e. reduction) in thermally induced deformation of an optical component within a lithographic apparatus may be obtained by constructing the optical component from a material having a zero-crossing temperature for thermal expansion (i.e. a temperature at which there is no thermal expansion) and a good heat conductivity at its ZCT. It is particularly preferred that, for a particular material at its ZCT:

$$\frac{d\alpha/dT}{k} < 1.2 \times 10^{-9} \text{ m/W/K}$$

where T is temperature (in K), α the thermal expansion coefficient (in $K^{-1}$) and k the thermal conductivity (in W/m/K).

By way of further example only, optical components may be constructed from germanium and cooled to a temperature of 50 K. Other suitable materials include, for example, silicon carbide.

It is described above that optical components may be cooled to their ZCT to prevent thermal expansion during operation of the lithographic apparatus LA. It may additionally be desirable to cool the substrate W to prevent thermal expansion of the substrate W. Additionally, by cooling the substrate W, outgassing of the resist on the substrate is beneficially reduced.

Additionally, by cooling the substrate W to a low temperature, a phenomenon known as 'resist blur' may be avoided. Resists, after exposure may suffer from diffusion of radicals or 'activated species'. As a result, after development of an exposed resist, an edge of patterns may have shifted (e.g., by several nm) with respect to the original light pattern. At low temperatures diffusion process within the resist are much slower. Thus, by cooling the substrate W to, for example, 125 K, less resist blur is experienced.

Figure 5:
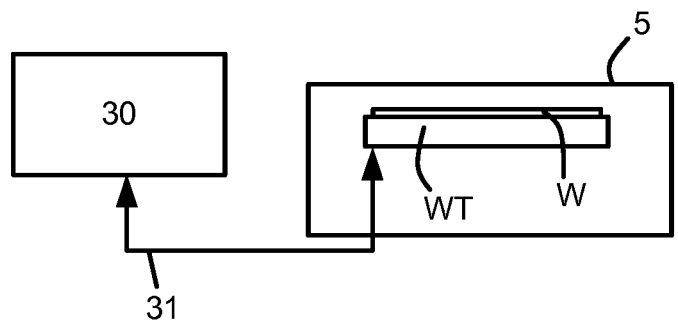
FIG. 5 schematically depicts a substrate cooling system according to an embodiment described herein.

FIG. 5 schematically illustrates a further exemplary arrangement in which a cooling apparatus 30 is arranged to cool the substrate table WT and thereby cool the substrate W. In particular, the cooling apparatus 30 may be arranged to cool the substrate table WT to a temperature of approximately 123 K, thereby allowing for heat from the substrate W to drain through the substrate table WT. In a particularly preferred embodiment, the substrate table WT is constructed from silicon. In this way, differences in expansion between the substrate table WT and the substrate W (which may lead to relative movement between the substrate table WT and the substrate W, and therefore overlay errors) may be avoided. Additionally, at a temperature of approximately 123 K, outgassing of the resist will be substantially reduced. In this way, the need for a dynamic gas lock (DGL) between the substrate W and the illuminator IL may be reduced or removed.

It will be appreciated that the cooling apparatus 1 may be arranged in any way which is suitable for cooling the substrate table WT. In one embodiment, the cooling apparatus may be arranged to cool and pump liquid nitrogen through a schematically depicted conduit 31. Liquid nitrogen may be pumped through channels (not shown) that contact an under-side of the substrate table WT or which pass through the substrate table WT. The conduit 31 may be permanently connected to the substrate table WT, passing through the housing having internal walls 5. The conduit 31 may therefore be flexible to allow for pumping of the coolant during movement of the substrate table.

Figure 6:
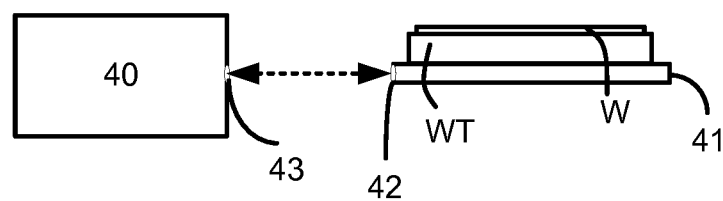
FIG. 6 schematically depicts a substrate cooling system according to an embodiment described herein.

FIG. 6 schematically depicts an alternative embodiment in which the substrate table WT comprises a container 41 for receiving liquid nitrogen from a cooling apparatus 40, and to store the received liquid nitrogen under pressure. The container 41 comprises a port 42 arranged for interface with a port 43 provided on the cooling apparatus. Between scanning of a substrate W, when the substrate table WT is stationary, the container 41 is docked with the cooling apparatus 40 via the ports 42, 43, to receive a supply of liquid nitrogen. Once the container 41 is filled, the container 41 undocks from the cooling apparatus 40 and is sealed. Cooling of the substrate table WT therefore occurs using the latent heat of the boiling of the liquid nitrogen within the container 41. For example, to cool the substrate table WT to a preferred temperature of approximately 123 K, the container 41 may be arranged to store liquid nitrogen at a pressure of 30 bar. It will be appreciated that the necessary volume of liquid nitrogen stored within the container 41 will depend upon construction of the substrate table WT, the duration of scanning operations performed and the heat load caused by the radiation beam B received at the substrate W. By way of example only, however, for a suitable substrate table WT, the latent heat of 1 liter of liquid nitrogen at a pressure of 30 bar would be sufficient to cool the substrate table WT (and thereby the substrate W) to a temperature of approximately 123 K for a time period of approximately 10 minutes when receiving a heat load of 100 W.

Upon re-docking with the cooling apparatus 40, the spent liquid nitrogen is drained from the container 41 and replaced with fresh liquid nitrogen for the next scanning operation. As the cooling is provided by the evaporation of the liquid nitrogen (the latent heat is used for absorbing the heat load), a volume of nitrogen gas is generated within the container 41 which is greater than the initial volume of liquid nitrogen. The generated nitrogen gas may either be kept within the container 41 or drained via a hose to an exhaust. In some embodiments, the pressure in the container 41 is maintained at a constant (e.g., in order to facilitate maintaining the temperature at 123 K). For example, where the gas is drained via a hose, the rate at which the gas is drained is selected so as to maintain a constant pressure within the container. In another embodiment, the volume of the container 41 is constructed so as to increase over time to cope with the generated nitrogen gas. Upon docking, after draining of the nitrogen gas, the container 41 reverts to the smaller initial volume to receive fresh liquid nitrogen. To facilitate an increase in size, the container 41 may be constructed with a bellows, for example.

The container 41 may be in thermal contact with the substrate table WT by any appropriate means. For example, channels (not shown) may be provided within the substrate table WT and those channels may be in fluid communication with the container 41. Put another way, the container 41 may include channels formed within the substrate table WT. Alternatively, mechanical contact between the underside of the substrate table WT and the upper portion of the container 41 (as depicted in FIG. 6) may be sufficient to provide a desired conduction of heat from the substrate table WT to the liquid nitrogen within the container 41.

Figure 7:
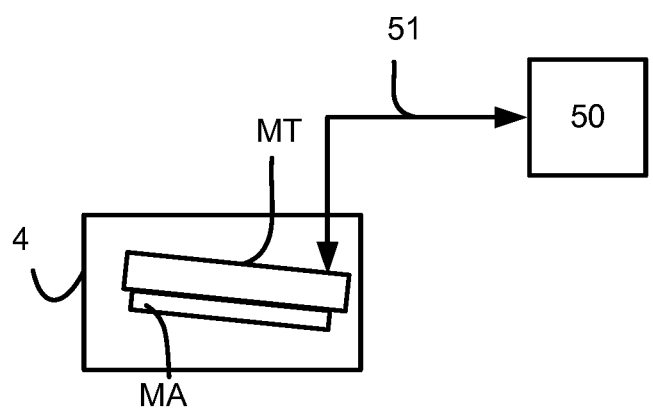
FIG. 7 schematically depicts a patterning device cooling system according to an embodiment described herein.

FIG. 7 schematically illustrates a further exemplary arrangement in which a cooling apparatus 50 is arranged to cool the support structure MT and thereby cool the patterning device MA. In particular, the cooling apparatus 50 may be arranged to cool the support structure MT to a temperature of approximately 123 K, thereby allowing for heat from the patterning device MA to drain through the support structure MT. In a particularly preferred embodiment, the support structure MT is also constructed from silicon. In this way, differences in expansion between the support structure MT and the patterning device MA (which may lead to relative movement between the support structure MT and the patterning device MA and therefore overlay errors) may be avoided.

In one embodiment, the cooling apparatus 50 may be arranged to cool and pump liquid nitrogen through a schematically depicted conduit 51. Liquid nitrogen may be pumped through channels (not shown) that contact an underside of the internal support structure MT or which pass through the support structure MT.

Figure 8:
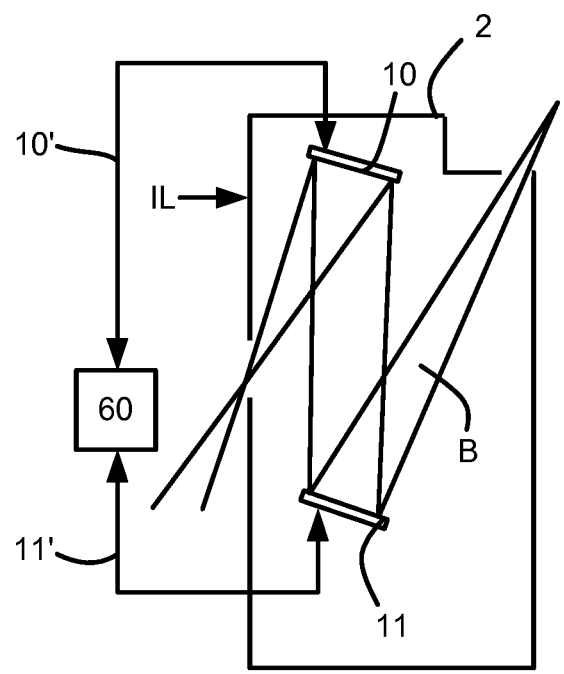
FIG. 8 schematically depicts an cooling system for an illumination system according to an embodiment described herein.

FIG. 8 schematically illustrates a further exemplary arrangement in which a cooling apparatus 60 is arranged to cool the internal optical components of the illuminator IL. In the exemplary embodiment depicted in FIG. 8, the cooling apparatus 60 is arranged to cool the mirrors 10, 11. The cooling apparatus 60 may be arranged to cool and pump a coolant (such as liquid nitrogen) through schematically depicted conduits 10'-11'.

In an embodiment, liquid nitrogen may be pumped through channels (not shown) that contact an 'underside' (i.e. a side which does not receive the radiation beam B) of the mirrors 10, 11 or which pass through a body of the mirrors 10, 11. It will be appreciated that the cooling apparatus 60 may be arranged in any way which is suitable for cooling one or more of the mirrors 10, 11. It will be appreciated that the necessary volume of liquid nitrogen provided to the mirrors 10, 11 will depend upon construction of the mirrors 10, 11, the duration of scanning operations performed and the heat load caused by the radiation beam B received at the mirrors 10, 11.

Figure 9:
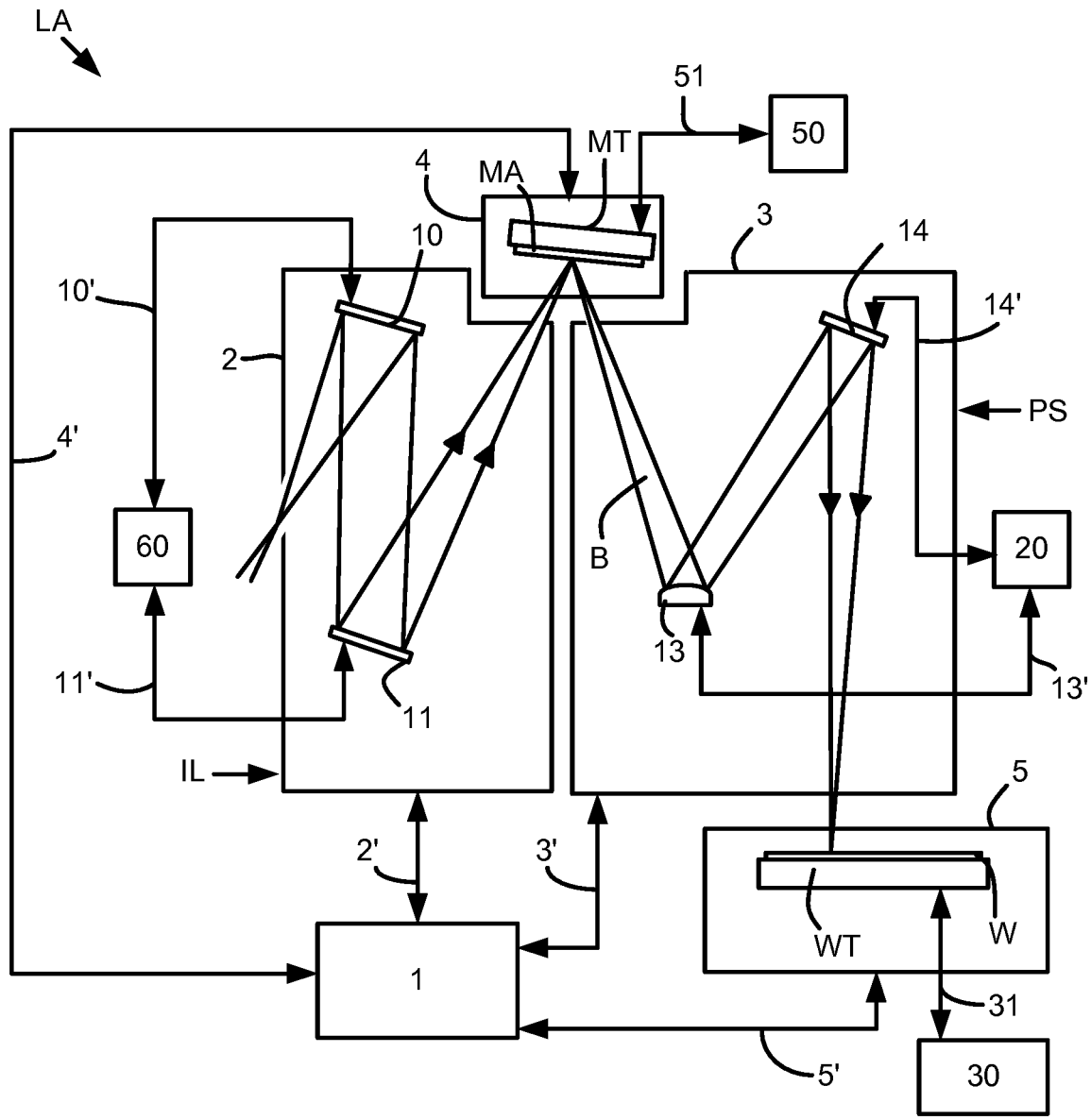
FIG. 9 schematically depicts a lithographic apparatus comprising a plurality of cooling apparatuses according to an embodiment described herein.

FIG. 9 schematically illustrates the lithographic apparatus LA as shown in FIG. 1, having the additional cooling apparatuses 20, 30, 50, 60. The source SO has been omitted from FIG. 9 for clarity. While in FIG. 9, the cooling apparatuses 20, 30, 50, 60 are provided in combination with each other and in combination with the cooling apparatus 1, it will be appreciated that cooling of the optical components of the lithographic apparatus (e.g., by any of the cooling apparatuses 20, 30, 40, 50, 60) may be provided without cooling the inner walls of the lithographic apparatus (e.g., without the cooling apparatus 1). Equally, cooling of the inner walls of the lithographic apparatus (e.g., using the cooling apparatus 1) may be provided without cooling the optical components of the lithographic apparatus. Further, cooling of any one of the optical components may be provided without cooling others of the optical components. Additionally, it is to be understood that the depiction of particular optical components is merely exemplary and that the techniques described herein may be applied to more or fewer optical components within the lithographic apparatus LA.

It will be appreciated that each of the other cooling apparatuses described herein may operate similarly to the cooling apparatus 40. That is, while each of the cooling apparatuses 10, 20, 30, 50, 60 are generally described as having conduits for pumping coolant to a during scanning operation, each cooling apparatus 10, 20, 30, 50, 60 may comprise one or more coolant containers in thermal contact with a optical component and arranged to be separably coupled (docked) to a coolant source between scanning operations. By providing coolant containers which are positioned within, for example, the internal walls 2-5, and by removing the need for coolant conduits to pass through the internal walls 2-5, the maintenance of a desired atmosphere (such as an ultra-high vacuum) within the internal walls 2-5 is facilitated.

While each of the cooling apparatuses 1, 20, 30, 40, 50, 60 are generally schematically depicted by a single box, it will be appreciated that the cooling apparatuses may comprise a plurality of components. For example, the cooling apparatuses may comprise one or more temperature sensors allowing for the cooling apparatus to operate under a feedback control-loop.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

It is to be understood that any suitable source may be used to generate EUV radiation. For example, EUV emitting plasma may be produced by using an electrical discharge to convert fuel (e.g. tin) to a plasma state. A radiation source of this type may be referred to as a discharge produced plasma (DPP) source. The electrical discharge may be generated by a power supply which may form part of the radiation source or may be a separate entity that is connected via an electrical connection to the radiation source SO. As an alternative example, a free electron laser (FEL)-based source may be used.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus arranged to project a pattern from a patterning device onto a substrate, the lithographic apparatus comprising:
    at least one housing comprising at least one internal wall;
    at least one optical component arranged within at least one chamber defined at least in part by the at least one internal wall and configured to receive a radiation beam;
    a cooling apparatus arranged to cool at least a portion of the at least one internal wall to a temperature below that of the at least one optical component such that during use of the cooling apparatus at least one contaminant within the housing rests preferentially on the internal wall relative to the optical component;
    at least one further cooling apparatus arranged to cool the at least one optical component, the at least one further cooling apparatus comprising a coolant container arranged to hold liquid nitrogen at a pressure of 30 bar; prior to an exposure operation of the lithographic apparatus, the lithographic apparatus comprising a controller configured to cause:
    heating of the at least one optical component to increase a temperature difference between the at least one optical component and the at least a portion of the at least one internal wall.

2. The lithographic apparatus of claim 1, wherein the cooling apparatus is arranged to provide a difference in temperature between the at least a portion of the at least one internal wall and the at least one optical component of at least 40 K.

3. The lithographic apparatus of claim 1, wherein the cooling apparatus is arranged to cool the at least a portion of the internal wall to a temperature of 77 K or below.

4. The lithographic apparatus of claim 1 wherein the at least one housing comprises at least one of:
    an illumination system configured to condition a radiation beam;
    a support structure constructed to support a patterning device, the patterning device being capable of imparting the radiation beam with a pattern in its cross-section to form a patterned radiation beam; and
    a substrate table constructed to hold the substrate;
    a projection system configured to project the patterned radiation beam onto the substrate.

5. The lithographic apparatus of claim 4, wherein the at least one optical component comprises at least one of:
    one or more optical components within the illumination system;
    the patterning device; and
    one or more optical components within the projection system.

6. The lithographic apparatus of claim 1, wherein the lithographic apparatus is arranged to provide an ultra-high vacuum within a chamber at least partially defined by the at least one internal wall.

7. The lithographic apparatus of claim 1, wherein the at least one contaminant comprises at least one of hydrocarbons and water.

8. The lithographic apparatus of claim 1, wherein the cooling apparatus is arranged to provide liquid nitrogen to the at least one internal wall.

9. The lithographic apparatus of claim 1, wherein the at least one optical component comprises at least one of a mirror, a lens, the substrate and a patterning device.

10. The lithographic apparatus of claim 1, wherein the at least one further cooling apparatus comprises a substrate cooling apparatus arranged to cool the substrate.

11. The lithographic apparatus of claim 10, wherein the substrate cooling apparatus comprises an apparatus arranged to cool a substrate table constructed to hold the substrate.

12. The lithographic apparatus of claim 11, wherein the substrate cooling apparatus comprises:
    the coolant container within, or in thermal communication with, the substrate table;
    a coolant supply apparatus arranged for releasable connection to the coolant container and arranged to provide coolant to the coolant container and to drain spent coolant from the coolant container.

13. The lithographic apparatus of claim 1, wherein the at least one optical component comprises a material having a zero-crossing-temperature of a coefficient of thermal expansion and the cooling apparatus is arranged to cool the at least one optical component such that the at least one optical component is maintained within a predetermined range of temperatures around the zero-crossing-temperature during an exposure operation of the lithographic apparatus.

14. The lithographic apparatus of claim 1, wherein the at least one optical component is constructed from silicon.

15. The lithographic apparatus of claim 1, wherein the at least one further cooling apparatus is arranged to cool the at least one optical component to a temperature of between approximately 122 and 125 K.

16. The lithographic apparatus of claim 1, wherein the at least one further cooling apparatus is arranged to provide liquid nitrogen to the at least one optical component or to a component in thermal contact with the at least one optical component.

17. The lithographic apparatus of claim 1, further comprising a source arranged to generate the radiation beam in the form of an EUV radiation beam.

18. A method comprising:
a first cooling comprising cooling at least a portion of at least one internal wall of a lithographic apparatus arranged to project a pattern from a patterning device onto a substrate,
the first cooling comprising cooling to a temperature below that of at least one optical component arranged within at least one chamber defined at least in part by the at least one internal wall, the at least one optical component configured to receive a radiation beam;
the first cooling being such that during the cooling at least one contaminant within the housing rests preferentially on the internal wall relative to the at least one optical component;
a second cooling comprising cooling, by a cooling apparatus arranged to hold liquid nitrogen at a pressure of 30 bar, the at least one optical component; and
prior to an exposure operation of the lithographic apparatus:
heating the at least one optical component to increase a temperature difference between the at least one optical component and the at least a portion of the at least one internal wall.

19. The method of claim 18,
wherein cooling at least a portion of at least one internal wall is performed prior to an exposure operation of the lithographic apparatus.

20. The method of claim 18, wherein cooling at least a portion of at least one internal wall provides a difference in temperature between the at least a portion of the at least one internal wall and the at least one optical component of at least 40 K.

21. The method of claim 18, wherein cooling at least a portion of at least one internal wall cools the at least a portion of the internal wall to a temperature of 77 K or below.

22. The method of claim 18, wherein the first cooling provides an ultra-high vacuum within a chamber at least partially defined by the at least one internal wall.

23. The method of claim 18, wherein the at least one contaminant comprises at least one of hydrocarbons and water.

24. The method of claim 18, wherein cooling at least a portion of at least one internal wall comprises providing liquid nitrogen to the at least one internal wall.

25. The method of claim 18, wherein the at least one optical component comprises at least one of a mirror, a lens, the substrate and a patterning device.

26. The method of claim 18, wherein cooling the at least one optical component comprises cooling the substrate.

27. The method of claim 26, wherein cooling the substrate comprises cooling a substrate table constructed to hold the substrate.

28. The method of claim 18, wherein cooling the at least one optical component comprises cooling the at least one optical component such that the at least one optical component is maintained within a predetermined range of temperatures around a zero-crossing-temperature of a coefficient of thermal expansion of the optical component during an exposure operation of the lithographic apparatus.

29. The method of claim 18, wherein cooling the at least one optical component comprises cooling the at least one optical component to a temperature of between approximately 122 and 125 K prior to an exposure operation of the lithographic apparatus.

30. The method of claim 18, wherein cooling the at least one optical component comprises providing liquid nitrogen to the at least one optical component or to a component in thermal contact with the at least one optical component.

31. The method of claim 18, wherein cooling the at least one optical component occurs after the heating of the at least one optical component.

32. A lithographic apparatus arranged to project a pattern from a patterning device onto a substrate, the lithographic apparatus comprising:
at least one optical component configured to receive a radiation beam; and
at least one cooling apparatus arranged to cool the at least one optical component, wherein the at least one cooling apparatus comprises a substrate cooling apparatus arranged to cool the substrate,
the substrate cooling apparatus comprising a coolant container arranged to hold liquid nitrogen at a pressure of 30 bar; and
wherein the at least one optical component comprises a material having a zero-crossing-temperature of a coefficient of thermal expansion and the at least one cooling apparatus is arranged to cool the at least one optical component such that the at least one optical component is maintained within a predetermined range of temperatures around the zero-crossing-temperature during an exposure operation of the lithographic apparatus.

33. The lithographic apparatus of claim 32, wherein at the zero-crossing-temperature of the material:

$$\frac{d\alpha/dT}{k} < 1.2 \times 10^{-9}$$

where T is temperature, α the coefficient of thermal expansion, and k is the thermal conductivity of the material.

34. The lithographic apparatus of claim 32, wherein the at least one optical component comprises at least one selected from the list comprising: a mirror, a lens, the substrate and a patterning device.

35. The lithographic apparatus of claim 32, wherein the at least one optical component is constructed from silicon.

36. The lithographic apparatus of claim 32, wherein the at least one cooling apparatus is arranged to cool the at least one optical component to a temperature of between approximately 122 and 125 K prior to an exposure operation of the lithographic apparatus.

37. The lithographic apparatus of claim 32, wherein the at least one cooling apparatus is arranged to cool the at least one optical component to a temperature of approximately 123 K during an exposure operation of the lithographic apparatus.

38. The lithographic apparatus of claim 32, wherein the substrate cooling apparatus is arranged to cool a substrate table constructed to hold the substrate.

39. The lithographic apparatus of claim 38, wherein
the coolant container is within, or in thermal communication with, the substrate table,
and the lithographic apparatus further comprises a coolant supply apparatus arranged for releasable connection to the coolant container and arranged to provide coolant to the coolant container and to drain spent coolant from the coolant container.

40. The lithographic apparatus of claim 32, wherein the at least one cooling apparatus is arranged to provide liquid nitrogen to the at least one optical component or to a component in thermal contact with the at least one optical component.

\* \* \* \* \*